United States Patent
Yoshida

(10) Patent No.: US 12,243,927 B2
(45) Date of Patent: Mar. 4, 2025

(54) SEMICONDUCTOR DEVICE HAVING NICKEL OXIDE FILM ON GATE ELECTRODE

(71) Applicant: SUMITOMO ELECTRIC DEVICE INNOVATIONS, INC., Kanagawa (JP)

(72) Inventor: Tomohiro Yoshida, Kanagawa (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 407 days.

(21) Appl. No.: 17/652,749

(22) Filed: Feb. 28, 2022

(65) Prior Publication Data
US 2022/0293763 A1 Sep. 15, 2022

(30) Foreign Application Priority Data
Mar. 12, 2021 (JP) .................. 2021-040305

(51) Int. Cl.
*H01L 29/47* (2006.01)
*H01L 21/02* (2006.01)
*H01L 21/285* (2006.01)
*H01L 29/40* (2006.01)
*H01L 29/66* (2006.01)
*H01L 29/778* (2006.01)

(52) U.S. Cl.
CPC ...... *H01L 29/475* (2013.01); *H01L 21/02244* (2013.01); *H01L 21/28581* (2013.01); *H01L 29/401* (2013.01); *H01L 29/66462* (2013.01); *H01L 29/7786* (2013.01)

(58) Field of Classification Search
CPC ............. H01L 29/475; H01L 21/02244; H01L 21/28581; H01L 29/7786
USPC ........................................................ 257/194
See application file for complete search history.

(56) References Cited

U.S. PATENT DOCUMENTS

| | | | |
|---|---|---|---|
| 8,741,715 B2 | 6/2014 | Moore et al. | |
| 2011/0062438 A1* | 3/2011 | Kaneko | H01L 29/42316 257/43 |
| 2013/0256755 A1 | 10/2013 | Kurachi | |
| 2017/0125569 A1* | 5/2017 | Ozaki | H01L 29/7786 |
| 2019/0385859 A1 | 12/2019 | Nose | |

FOREIGN PATENT DOCUMENTS

| | | |
|---|---|---|
| JP | 2012-094726 | 5/2012 |
| JP | 2013-207086 | 10/2013 |
| JP | 2019-216188 | 12/2019 |

\* cited by examiner

*Primary Examiner* — Quoc D Hoang
(74) *Attorney, Agent, or Firm* — IPUSA, PLLC

(57) ABSTRACT

Semiconductor device includes a semiconductor layer, an insulating film provided on the semiconductor layer and having an opening formed therein, a gate electrode connected to the semiconductor layer through opening, a protection film covering gate electrode, and a Ni oxide film, wherein the insulating film has a first surface on the semiconductor layer side and a second surface opposite to the first surface, and the gate electrode has a third surface facing the second surface and spaced apart from the second surface and a fourth surface connecting the second surface and the third surface. The gate electrode includes a Ni film constituting the third surface and the fourth surface, and the Ni oxide film covers the Ni film on the third surface and the fourth surface. The protection film covers the third surface and the fourth surface by being placed over Ni oxide film.

6 Claims, 16 Drawing Sheets

SEMICONDUCTOR DEVICE HAVING NICKEL OXIDE FILM ON GATE ELECTRODE

CROSS REFERENCE TO RELATED APPLICATIONS

This application is based on and claims priority to Japanese Patent Application No. 2021-040305 filed on Mar. 12, 2021, and the entire contents of the Japanese patent application are incorporated herein by reference.

BACKGROUND OF THE INVENTION

1. Field of the Invention

The present disclosure relates to a semiconductor device and a method of manufacturing a semiconductor device.

2. Description of the Related Art

As semiconductor device including a high electron mobility transistor (HEMT), there has been proposed semiconductor device having a gate electrode including a base portion and an extension portion laterally extending from the base portion (Patent Document 1).

[Patent Document 1] U.S. Pat. No. 8,741,715
[Patent Document 2] Japanese Unexamined Patent Application Publication No. 2013-207086
[Patent Document 3] Japanese Unexamined Patent Application Publication No. 2019-216188

SUMMARY OF THE INVENTION

A semiconductor device of the present disclosure includes a semiconductor layer, an insulating film disposed on the semiconductor layer and having an opening, a gate electrode connected to the semiconductor layer through the opening, a protection film that covers the gate electrode, and a Ni oxide film, the insulating film having first surface facing the semiconductor layer, and a second surface opposite to the first surface, the gate electrode having a third surface spaced apart from the second surface and facing the second surface, and a fourth surface connecting the second surface and the third surface, the gate electrode including a Ni film that forms the third surface and the fourth surface, wherein the Ni oxide film covers the Ni film on the third surface and the fourth surface. The protection film covers the third surface and the fourth surface such that the protection film is laid over the Ni oxide film.

DESCRIPTION OF THE PREFERRED EMBODIMENTS

Figure 1:
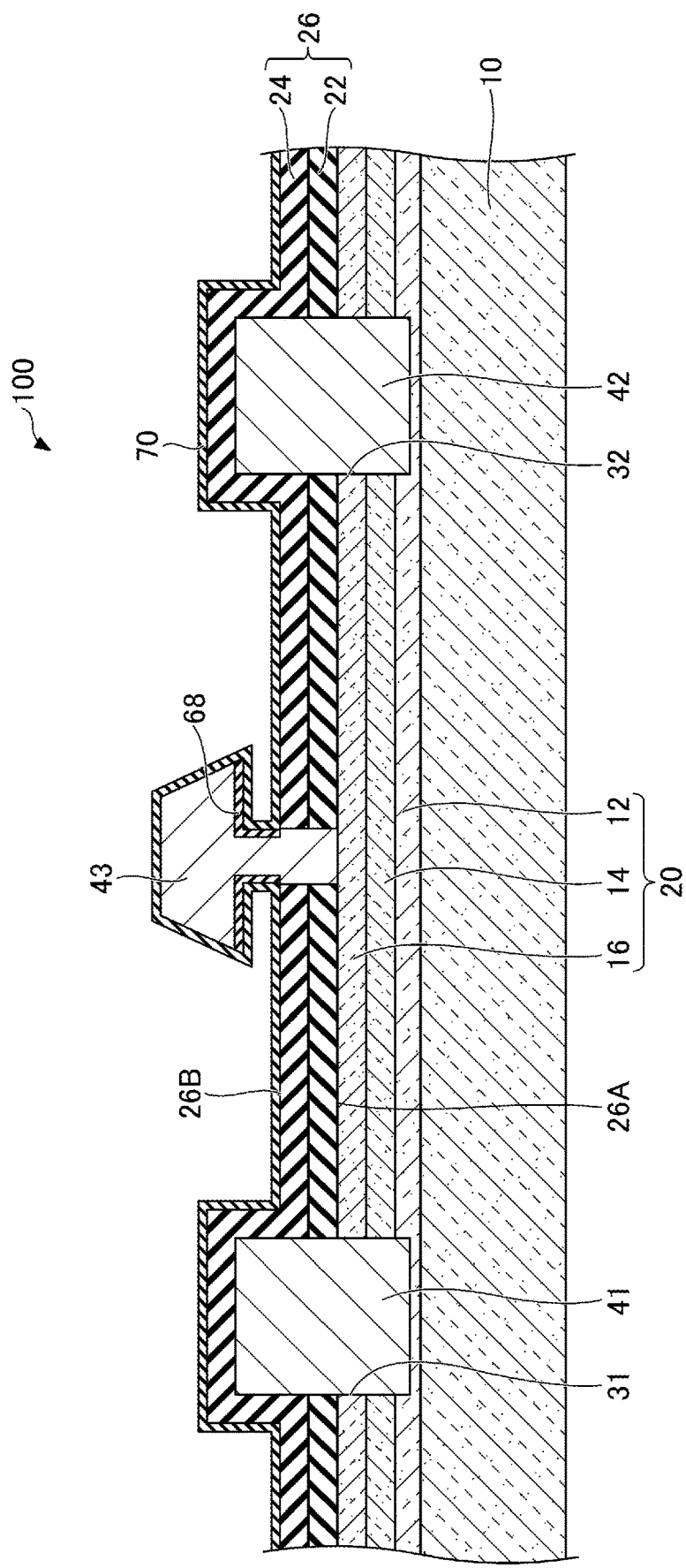
FIG. 1 is a cross-sectional view illustrating an overview of a semiconductor device according to an embodiment.

In a conventional semiconductor device, the characteristics of a gate electrode may change.

An object of the present disclosure is to provide a semiconductor device capable of suppressing a change in the characteristics of a gate electrode, and a method of manufacturing the semiconductor device.

Embodiments of the present invention will be described below.

Description of Embodiments of the Present Disclosure

Embodiments of the present disclosure will be listed and described below. In the following description, the same or corresponding elements are denoted by the same reference numerals, and the same description thereof will not be repeated.

[1] A semiconductor device according to one aspect of the present disclosure includes a semiconductor layer, an insulating film disposed on the semiconductor layer and having an opening, a gate electrode connected to the semiconductor layer through the opening, a protection film that covers the gate electrode, and a Ni oxide film, the insulating film having a first surface facing the semiconductor layer, and a second surface opposite to the first surface, the gate electrode having a third surface spaced apart from the second surface and facing the second surface, and a fourth surface connecting the second surface and the third surface, the gate electrode including a Ni film that forms the third surface and the fourth surface, wherein the Ni oxide film covers the Ni film on the third surface and the fourth surface. The protection film covers the third surface and the fourth surface such that the protection film is laid over the Ni oxide film.

In a case where Ni film is exposed on the surface of the gate electrode and the Ni film is covered with a Si nitride film formed by a chemical vapor deposition (CVD) method as the protection film, Ni may be diffused into the protection film to change the characteristics of the gate electrode. In addition, in a case where the Ni film is covered with an Al oxide film formed by an atomic layer deposition (ALD) method as the protection film, Ni may be diffused at an interface between the protection film and the Ni film, and the characteristics of the gate electrode may be changed. In contrast, in the semiconductor device according to one aspect of the present disclosure, the Ni film is covered with the Ni oxide film on the third surface and the fourth surface, and the protection film covers the third surface and the fourth surface by being placed over the Ni oxide film. Therefore, the diffusion of Ni from the Ni film can be suppressed, and the change in the characteristics of the gate electrode can be suppressed.

[2] In [1], a space may be located between the second surface and a portion of the protection film, the portion covering the third surface. In this case, it is easy to reduce the parasitic capacitance between the gate electrode and a multi-layer structure.

[3] In [1] or [2], the protection film may include an Al oxide film or a Si nitride film. In this case, it is easy to protect the gate electrode from moisture intrusion from the outside.

[4] In [1] to [3], the Ni oxide film may have a thickness of more than or equal to 3 nm. In this case, diffusion of Ni from the Ni film can be more easily suppressed.

[5] In [1] to [4], the protection film may further covers the insulating film. In this case, the multi-layer structure can be more strongly protected.

In [1] to [5], the Ni film may have a first portion that is in contact with the insulating film, the first portion having an area that is less than or equal to 0.10 times as large as a second portion of the Ni film, the second portion being in contact with the Ni oxide film. In this case, diffusion of Ni in a portion of the Ni film in contact with the insulating film can be more easily suppressed.

[7] A semiconductor device according to another aspect of the present disclosure comprises a semiconductor layer, an insulating film disposed on the semiconductor layer and having an opening, a gate electrode connected to the semiconductor layer through the opening, a protection film that covers the gate electrode and the insulating film, the protection film including an Al oxide film or a Si nitride film, and a Ni oxide film, the insulating film having a first surface facing the semiconductor layer, and a second surface opposite to the first surface, the gate electrode having a third surface spaced apart from the second surface and facing the second surface, and a fourth surface connecting the second surface and the third surface, the gate electrode including a Ni film that forms the third surface and the fourth surface, and an Au film on the Ni film, wherein the Ni oxide film covers the Ni film on the third surface and the fourth surface. The protection film covers the third surface and the fourth surface such that the protection film is laid over the Ni oxide film. A space is located between the second surface and a portion of the protection film, the portion covering the third surface.

[8] A method of manufacturing semiconductor device according to another aspect of the present disclosure includes forming an insulating film on a semiconductor layer, the insulating film having a first surface facing the semiconductor layer, and the insulating film having a second surface opposite to the first surface, forming an opening in the insulating film, forming a metal layer, the metal layer being connected to the semiconductor layer through the opening, the metal layer having a third surface spaced apart from the second surface and facing the second surface, the metal layer having a fourth surface connecting the second surface and the third surface, the metal layer including a Ni film that forms the third surface and the fourth surface, oxidizing part of the Ni film to form a Ni oxide film that covers the Ni film on the third surface and the fourth surface, and forming a gate electrode from a remainder of the metal layer, and forming a protection film, the protection film covering the gate electrode while covering the third surface and the fourth surface such that the protection film is laid over the Ni oxide film.

Details of Embodiments of the Present Disclosure

Hereinafter, embodiments of the present disclosure will be described in detail. The present embodiment is not limited to these embodiments. In the specification and the drawings, components having substantially the same functional configuration are denoted by the same reference numerals and redundant descriptions thereof may be omitted.

Figure 2:
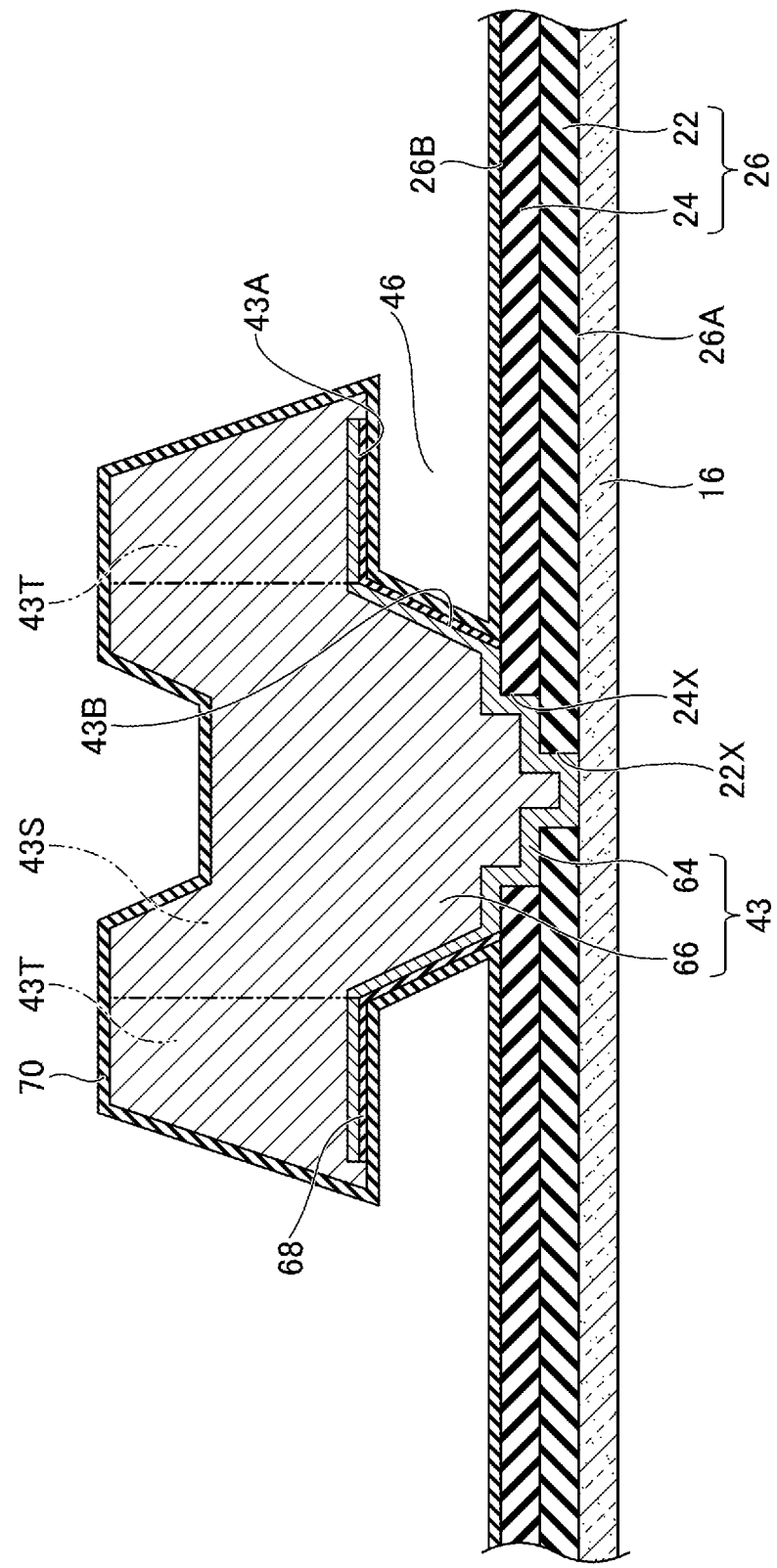
FIG. 2 is a cross-sectional view illustrating details of a gate electrode and its periphery in the semiconductor device according to the embodiment.

The embodiments relate to a semiconductor device including a GaN-HEMT having a nitride semiconductor as a main constituent material. FIG. 1 is a cross-sectional view illustrating an overview of a semiconductor device according to an embodiment. FIG. 2 is a cross-sectional view illustrating details of a gate electrode and its periphery in the semiconductor device according to the embodiment. FIGS. 1 and 2 show cross-sections perpendicular to the width direction of the gate electrode.

As shown in FIG. 1, a semiconductor device 100 according to the embodiment includes a substrate 10 and a multi-layer structure 20 comprised of a plurality of semiconductor layers formed on substrate 10. Substrate 10 is, for example, a SiC substrate having a (0001) plane, and the stacking direction of multi-layer structure 20 is, for example, a [0001] direction. Multi-layer structure 20 includes an electron transit layer 12, an electron supply layer 14, and a cap layer 16 that are sequentially formed on substrate 10. Electron transit layer 12 is, for example, an undoped GaN layer having a thickness of about 1000 nm. Electron supply layer 14 is, for example an n-type AlGaN layer having a thickness of about 20 nm. Cap layer 16 is, for example, an n-type GaN layer having a thickness 5 nm. Multi-layer structure 20 is an example of the semiconductor layer.

A first insulating film 22 is formed on multi-layer structure 20. First insulating film 22 is, for example, a Si nitride film. An opening 31 for a source and an opening 32 for a drain are formed in first insulating film 22 and multi-layer structure 20. A source electrode 41 in ohmic contact with multi-layer structure 20 is formed in opening 31, and a drain electrode 42 in ohmic contact with multi-layer structure 20 is formed in opening 32. A second insulating film 24 is formed on first insulating film 22, source electrode 41, and drain electrode 42. Second insulating film 24 is, for example, a Si nitride film. First insulating film 22 and second insulating film 24 are included in an insulating film 26. Insulating film 26 has a first surface 26A facing multi-layer structure 20 and a second surface 26B opposite to first surface 26A. First surface 26A is also the lower surface of insulating film 26, and second surface 26B is also the upper surface of insulating film 26. First surface 26A may be in contact with multi-layer structure 20.

As shown in FIG. 2, between source electrode 41 and drain electrode 42, an opening 22X is formed in first insulating film 22 and an opening 24X is formed in second insulating film 24. An opening width of opening 24X, i.e., the dimension in the gate length direction, is larger than an opening width of opening 22X. For example, the opening width of opening 24X is approximately 140 nm, and the opening width of opening 22X is approximately 90 nm. Opening 24X goes through second insulating film 24, and opening 22X goes through first insulating film 22. Opening 22X is exposed through opening 24X, and multi-layer structure 20 is exposed through openings 24X and 22X.

Semiconductor device 100 has a gate electrode 43 in contact with multi-layer structure 20 through openings 22X and 24X. Gate electrode 43 includes an Ni film 64 and an Au film 66 formed on Ni film 64. For example, the thickness of the Ni-film 64 is approximately 50 nm to 100 nm, and the thickness of the Au film 66 is approximately 300 nm to 600 nm. Gate electrode 43 has, for example, a T-shape in a cross-sectional view. That is, gate electrode 43 includes a base portion 43S and an extension portion 43T that extends from base portion 43S to both sides. Gate electrode 43 has a third surface 43A facing second surface 26B and spaced apart from second surface 26B of insulating film 26. Third surface 43A is also a lower surface of extension portion 43T. Gate electrode 43 further has a fourth surface 43B that connects second surface 26B and third surface 43A. Fourth surface 43B is also a side surface of a portion of base portion 43S that is situated above second surface 26B and below third surface 43A. The Ni film 64 forms third surface 43A and fourth surface 43B. Gate electrode 43 may have a Pd film between Ni film 64 and Au film 66, or may have a Ta film on Au film 66.

Semiconductor device 100 has a Ni oxide film 68 covering the Ni film 64 in third surface 43A and fourth surface 43B. Semiconductor device 100 further includes a protection film 70 covering gate electrode 43. Protection film 70 covers third surface 43A and fourth surface 43B by being placed over the Ni oxide film 68. Protection film 70 may cover not only gate electrode 43 but also insulating film 26. Protection film 70 is, for example, an Al oxide film or an Si nitride film. The thickness of protection film 70 is not limited to a particular value, but the thickness of a portion thereof covering the third surface 43A is preferably more than or equal to 20 nm, and more preferably more than or equal to 25 nm.

In the present embodiment, Ni film 64 is covered with Ni oxide film 68 on third surface 43A and fourth surface 43B. Therefore, the diffusion of Ni from Ni film 64 can be suppressed, and the change in the characteristics of gate electrode 43 can be suppressed.

A space 46 may exist between the portion of protection film 70 covering third surface 43A and second surface 26B. The presence of space 46 helps to reduce the parasitic capacitance between extension portion 43T of gate electrode 43 and multi-layer structure 20. Instead of space 46, a low dielectric constant (low-k) material may be disposed. The mechanical strength can be improved as compared with the case where space 46 is present. The relative dielectric constant of the low dielectric constant material is preferably 7.0 or less, and more preferably 4.0 or less.

When protection film 70 includes an Al oxide film or an Si nitride film, it is easy to protect gate electrode 43 from intrusion of moisture from the outside or the like. When protection film 70 covers insulating film 26, multi-layer structure 20 can be more strongly protected.

Ni oxide film 68 is thicker than a natural oxide film of Ni, and the thickness of Ni oxide film 68 is, for example, preferably 3 nm or more, and more preferably 5 nm or more. This is because diffusion of Ni from Ni film 64 is more easily suppressed with such an arrangement.

The area of the portion of Ni film 64 in contact with insulating film 26 is preferably less than or equal to 0.10 times as large as the area of the portion of Ni film 64 in contact with Ni oxide film 68, more preferably less than or equal to 0.07 times as large, and still more preferably less than or equal to 0.05 times as large. This is because diffusion of Ni from the portion of Ni film 64 in contact with insulating film 26 can be more easily suppressed.

Insulating film 26 may include a Si oxynitride film in contact with Ni film 64. For example, first insulating film 22 and second insulating film 24 may include a Si nitride film as a core and the Si oxynitride film covering the surface of the Si nitride film. Since insulating film 26 includes the Si oxynitride film in contact with Ni film 64, it is easy to suppress diffusion of Ni at the interface between Ni film 64 and insulating film 26.

In the following, a method of manufacturing semiconductor device 100 according to the embodiment will be described. FIGS. 3 to 16 are cross-sectional views illustrating the method of manufacturing a semiconductor device according to the embodiment. FIGS. 3 to 8 illustrate changes in the cross section illustrated in FIG. 1, and FIGS. 9 to 16 illustrate changes in the cross section illustrated in FIG. 2.

Figure 3:
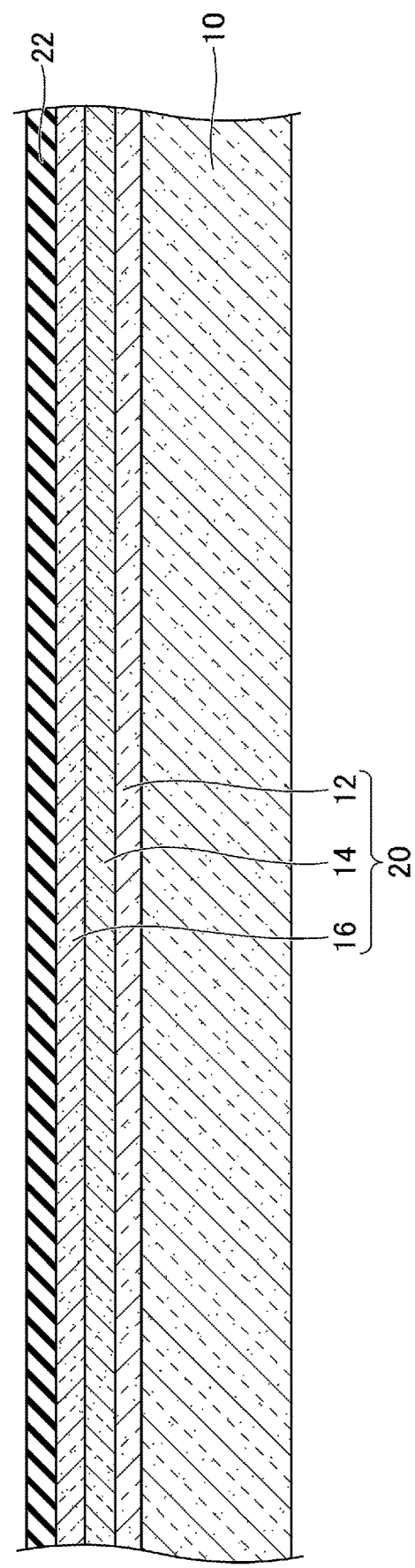
FIG. 3 is a cross-sectional view (part 1) illustrating the method for manufacturing the semiconductor device according to the embodiment.

First, as shown in FIG. 3, multi-layer structure 20 including a plurality of nitride semiconductor layers is grown on substrate 10 by metal organic chemical vapor deposition (MOCVD). Next, first insulating film 22 in contact with the upper surface of multi-layer structure 20 is formed by a low pressure (LP) CVD method. First insulating film 22 is, for example, a silicon nitride film having a thickness of 40 nm. Before forming electron transit layer 12, a nucleation layer may be formed on substrate 10, and electron transit layer 12 may be formed on the nucleation layer. The nucleation layer is, for example, an AlN layer having a thickness of several tens of nm.

Figure 4:
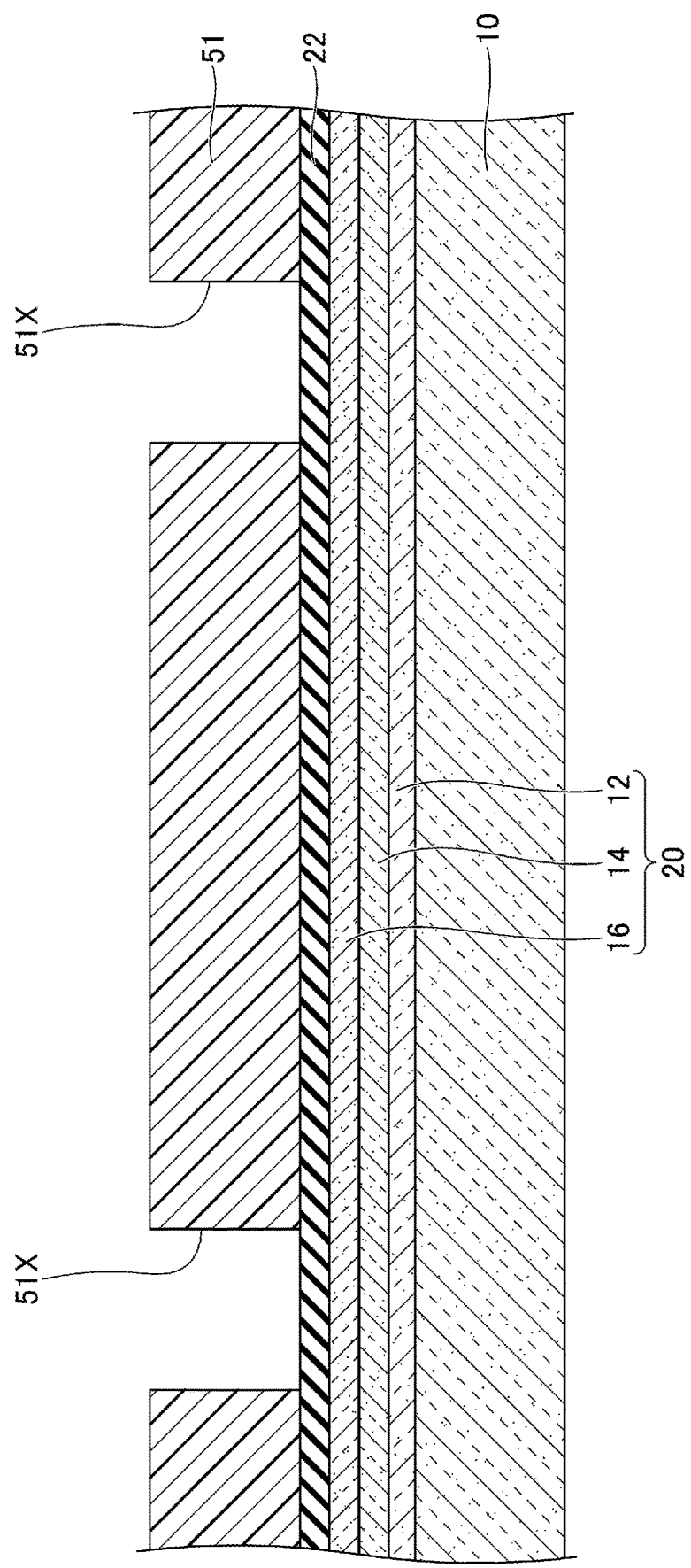
FIG. 4 is a cross-sectional view (part 2) illustrating the method for manufacturing the semiconductor device according to the embodiment.

Then, as shown in FIG. 4, first insulating film 22 is coated with an electron beam resist 51, and openings 51X are formed in electron beam resist 51 by electron-beam lithography. First insulating film 22 is exposed through openings 51X.

Figure 5:
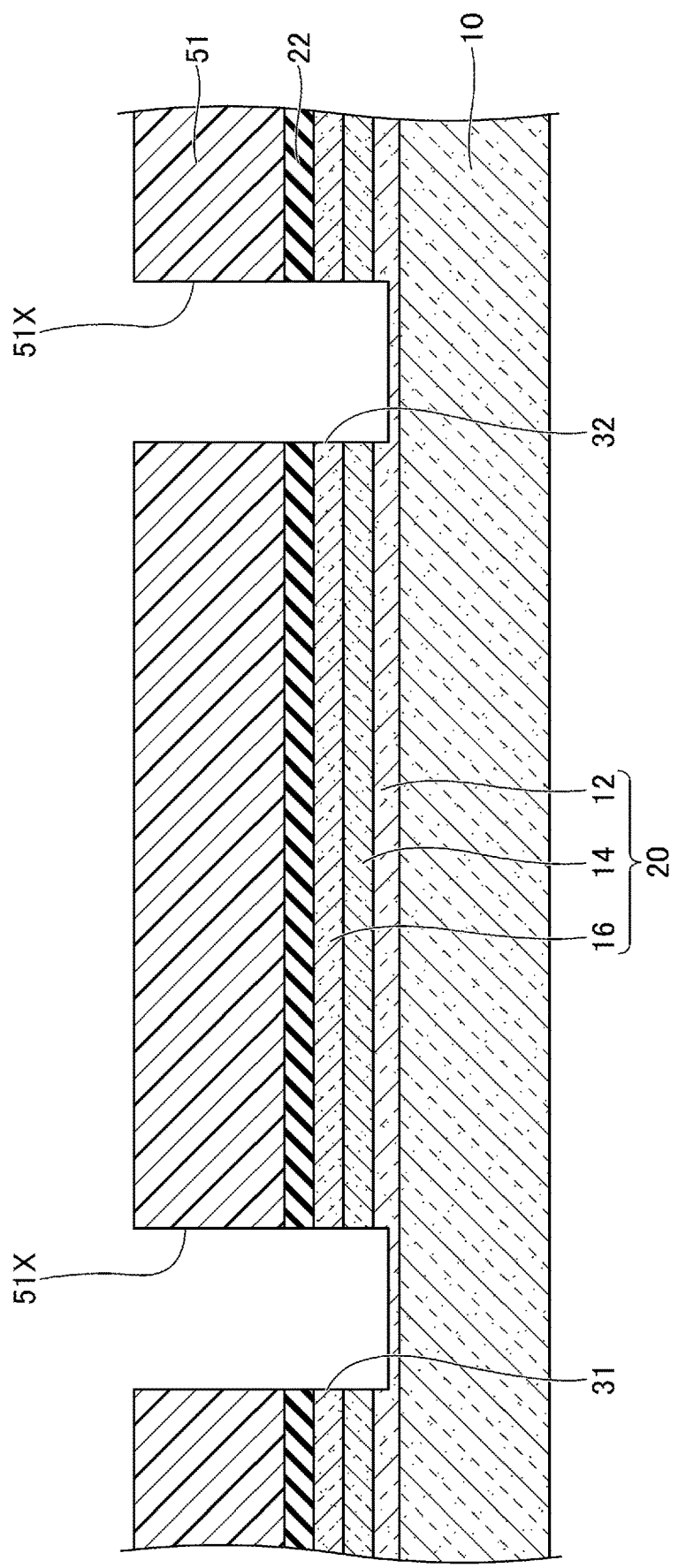
FIG. 5 is a cross-sectional view (part 3) illustrating the method for manufacturing the semiconductor device according to the embodiment.

As shown in FIG. 5, an opening 31 for a source and an opening 32 for a drain are formed in first insulating film 22 and multi-layer structure 20 by reactive ion etching (RIE) using electron beam resist 51 as a mask. For example, a reactive gas containing fluorine (F) is used to etch first insulating film 22, and a reactive gas containing chlorine (Cl) is used to etch multi-layer structure 20.

Figure 6:
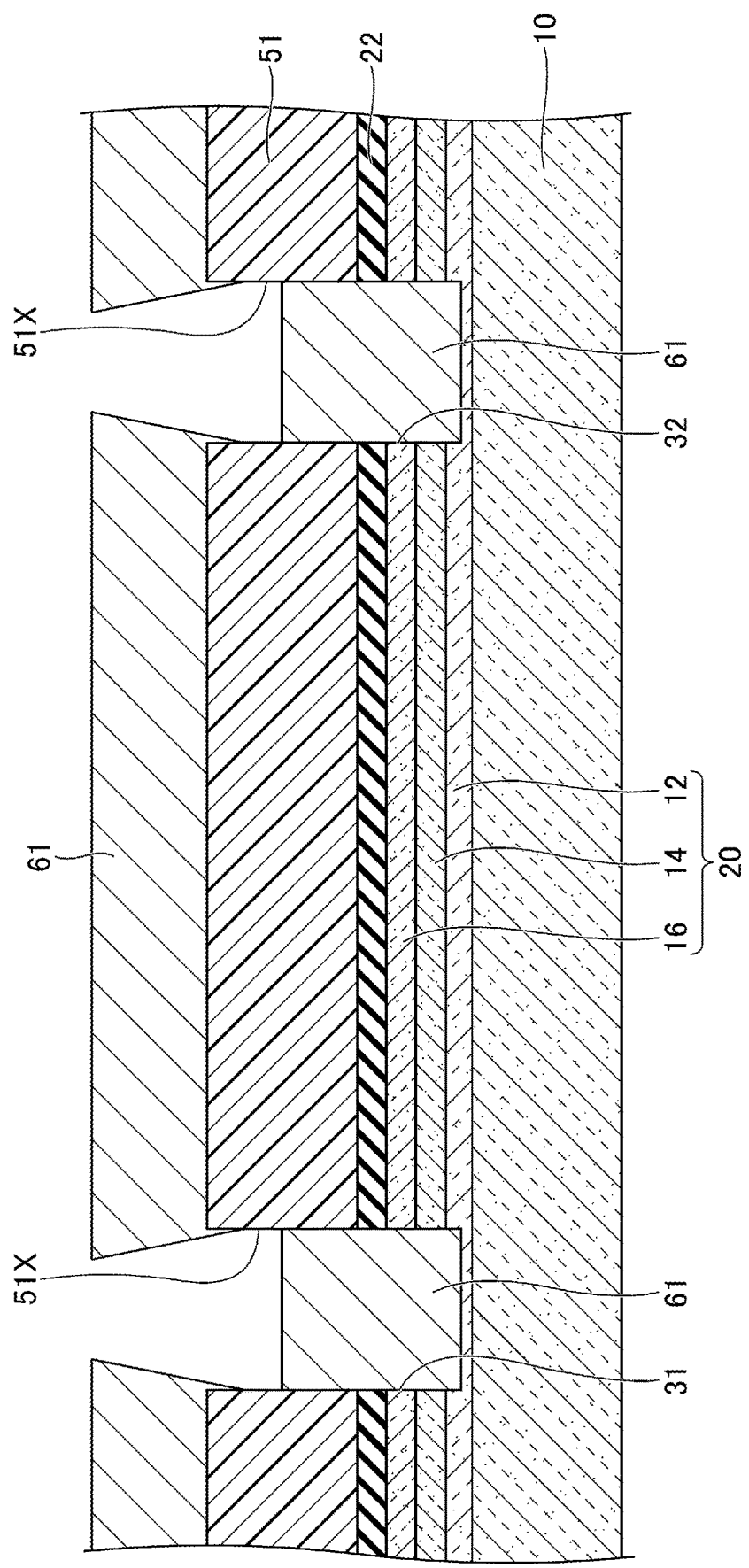
FIG. 6 is a cross-sectional view (part 4) illustrating the method for manufacturing the semiconductor device according to the embodiment.

As shown in FIG. 6, a metal layer 61 is formed inside opening 31 and inside opening 32 by an evaporation method. Metal layer 61 also adheres to the upper surface of electron beam resist 51 and the side wall surface of openings 51X. Metal layer 61 includes, for example, a Ta film, an Al film, and a Mo film formed on substrate 10 in this order.

Figure 7:
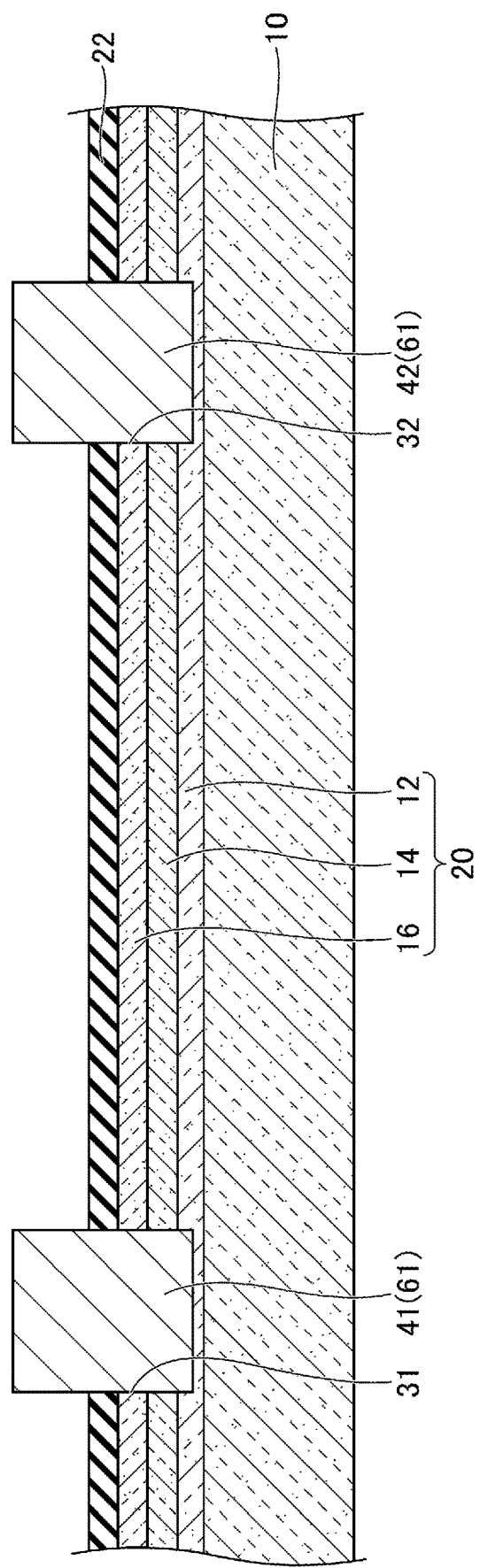
FIG. 7 is a cross-sectional view (part 5) illustrating the method for manufacturing semiconductor device according to the embodiment.

As shown in FIG. 7, electron beam resist 51 is removed. As electron beam resist 51 is removed, the portion of metal layer 61 adhered to electron beam resist 51 is also removed. On the other hand, the portion of metal layer 61 inside openings 31 and 32 remains intact. In other words, lift-off is performed. Thereafter, metal layer 61 is alloyed by heat treatment. As a result, source electrode 41 in ohmic contact with multi-layer structure 20 is formed in opening 31, and drain electrode 42 in ohmic contact with multi-layer structure 20 is formed in opening 32.

Figure 8:
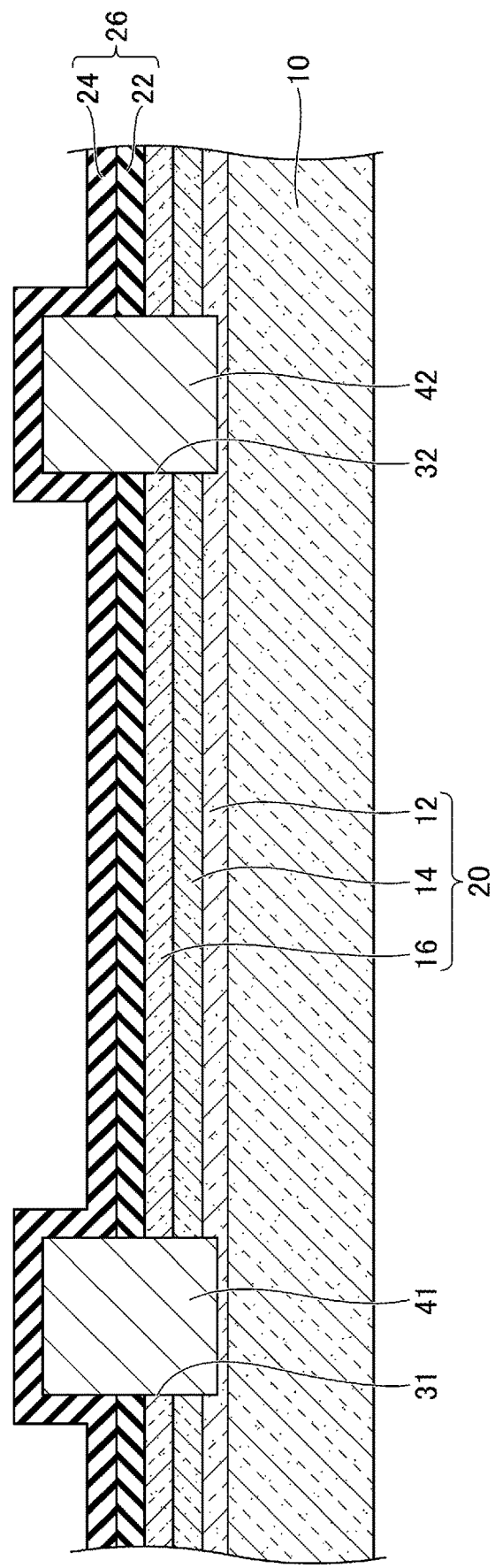
FIG. 8 is a cross-sectional view (part 6) illustrating the method for manufacturing semiconductor device according to the embodiment.

As shown in FIG. 8, second insulating film 24 is formed on first insulating film 22, source electrode 41, and drain electrode 42 by a plasma enhanced (PE) CVD method. Second insulating film 24 is, for example, a silicon nitride film having a thickness of 20 nm. First insulating film 22 and second insulating film 24 are included in insulating film 26.

Figure 9:
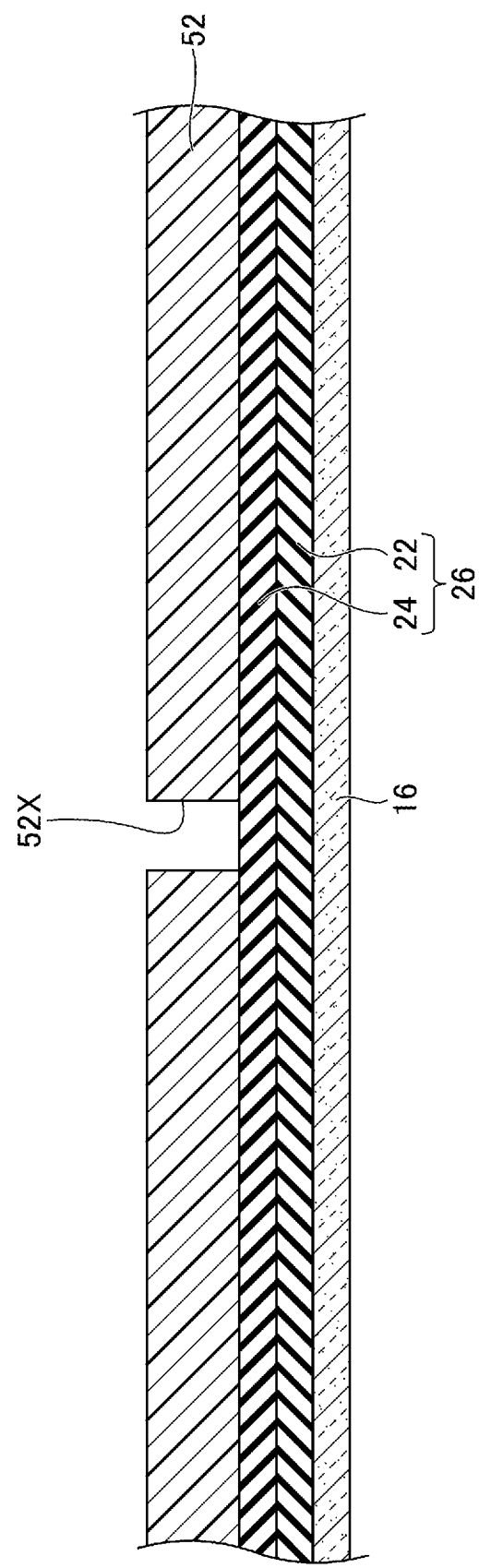
FIG. 9 is a cross-sectional view (part 7) illustrating the method for manufacturing semiconductor device according to the embodiment.

As shown in FIG. 9, an electron beam resist 52 is applied on second insulating film 24, source electrode 41, and drain electrode 42. For example, polymethyl methacrylate (PMMA) is used as electron beam resist 52. ZEP520A-7 manufactured by Zeon Corporation may be used as electron beam resist 52. Thereafter, an opening 52X is formed in electron beam resist 52 by electron-beam lithography. An opening width of opening 52X, i.e., a dimension in the gate length direction is, for example, approximately 70 nm. Second insulating film 24 is exposed through opening 52X.

Figure 10:
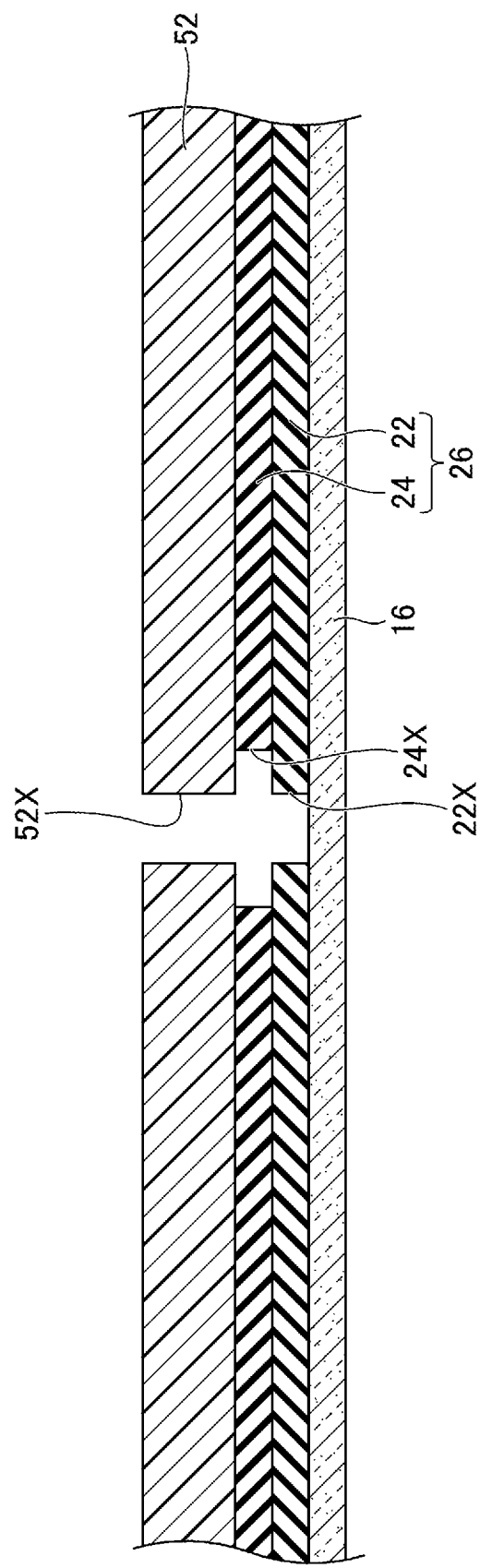
FIG. 10 is a cross-sectional view (part 8) illustrating the method for manufacturing the semiconductor device according to the embodiment.

As shown in FIG. 10, using electron beam resist 52 as a mask, an opening 24X for a gate is formed in second insulating film 24 by RIE using a reactive gas containing fluorine, and an opening 22X for the gate is formed in first insulating film 22. In the formation of openings 24X and 22X, second insulating film 24 and first insulating film 22 are etched under certain conditions. Particularly, a side etching occurs in second insulating film 24, and the opening width of opening 24X becomes larger than the opening width of opening 22X. For example, the opening width of opening 24X is approximately 140 nm, and the opening width of opening 22X is approximately 90 nm. Multi-layer structure 20 is exposed through openings 24X and 22X.

Figure 11:
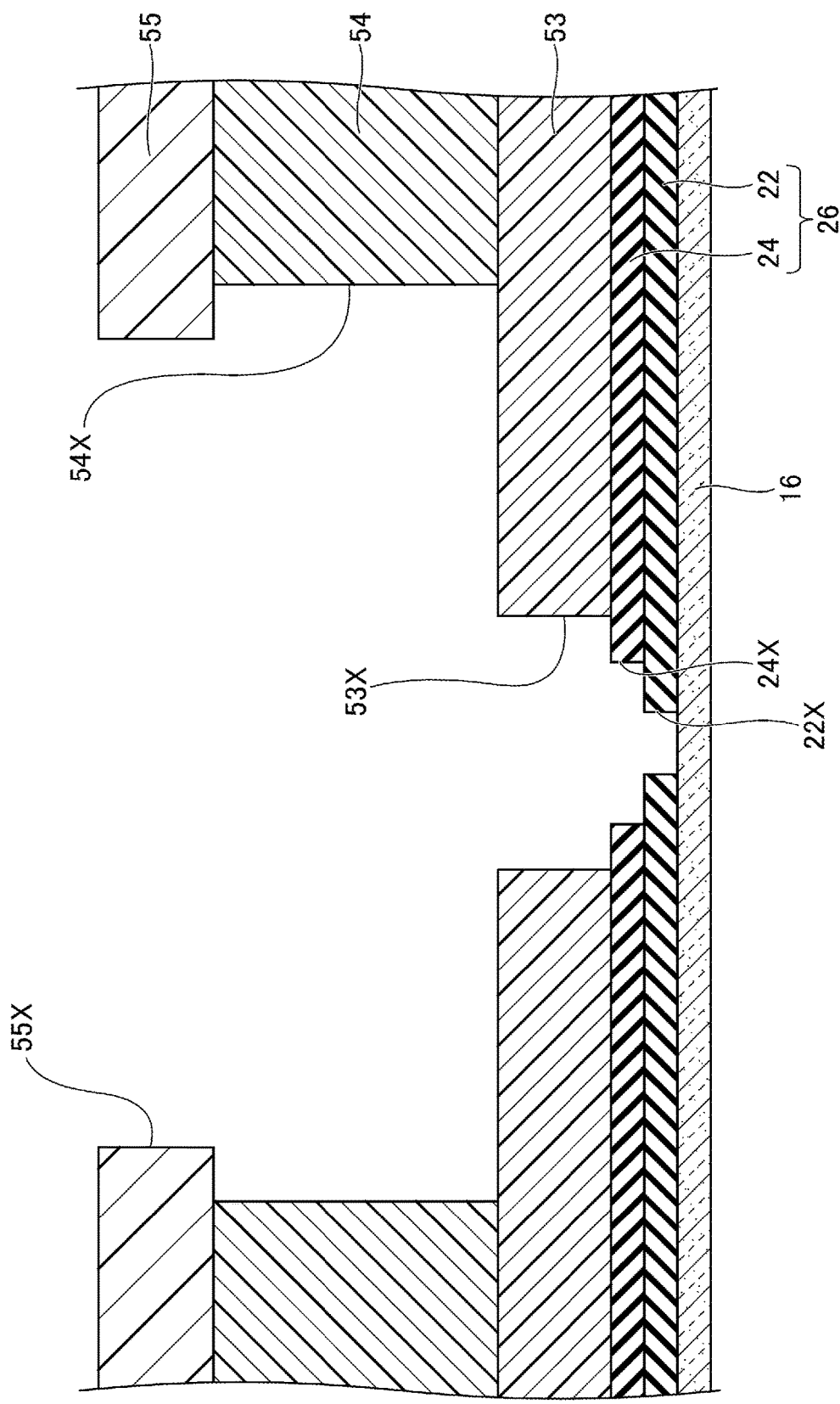
FIG. 11 is a cross-sectional view (part. 9) illustrating the method for manufacturing the semiconductor device according to the embodiment.

As shown in FIG. 11, electron beam resist 52 is removed. Subsequently, an electron beam resist 53, an electron beam resist 54, and an electron beam resist 55 are formed in this order on cap layer 16, first insulating film 22, second insulating film 24, source electrode 41, and drain electrode 42. PMMA is used as electron beam resists 53 and 55, and polymethylglutarimide (PMGI) is used as electron beam resist 54. Electron beam resists 53 and 55 can be processed more finely than electron beam resist 54. Further, by electron-beam lithography, an opening 55X is formed in electron beam resist 55, an opening 54X is formed in electron beam resist 54, and an opening 53X is formed in electron beam resist 53. For example, the opening width of opening 55X is approximately 500 nm, the opening width of opening 54X is approximately 580 nm, and the opening width of opening 53X is approximately 290 nm. Second insulating film 24, first insulating film 22, and cap layer 16 are exposed through openings 55X, 54X and 53X.

Figure 12:
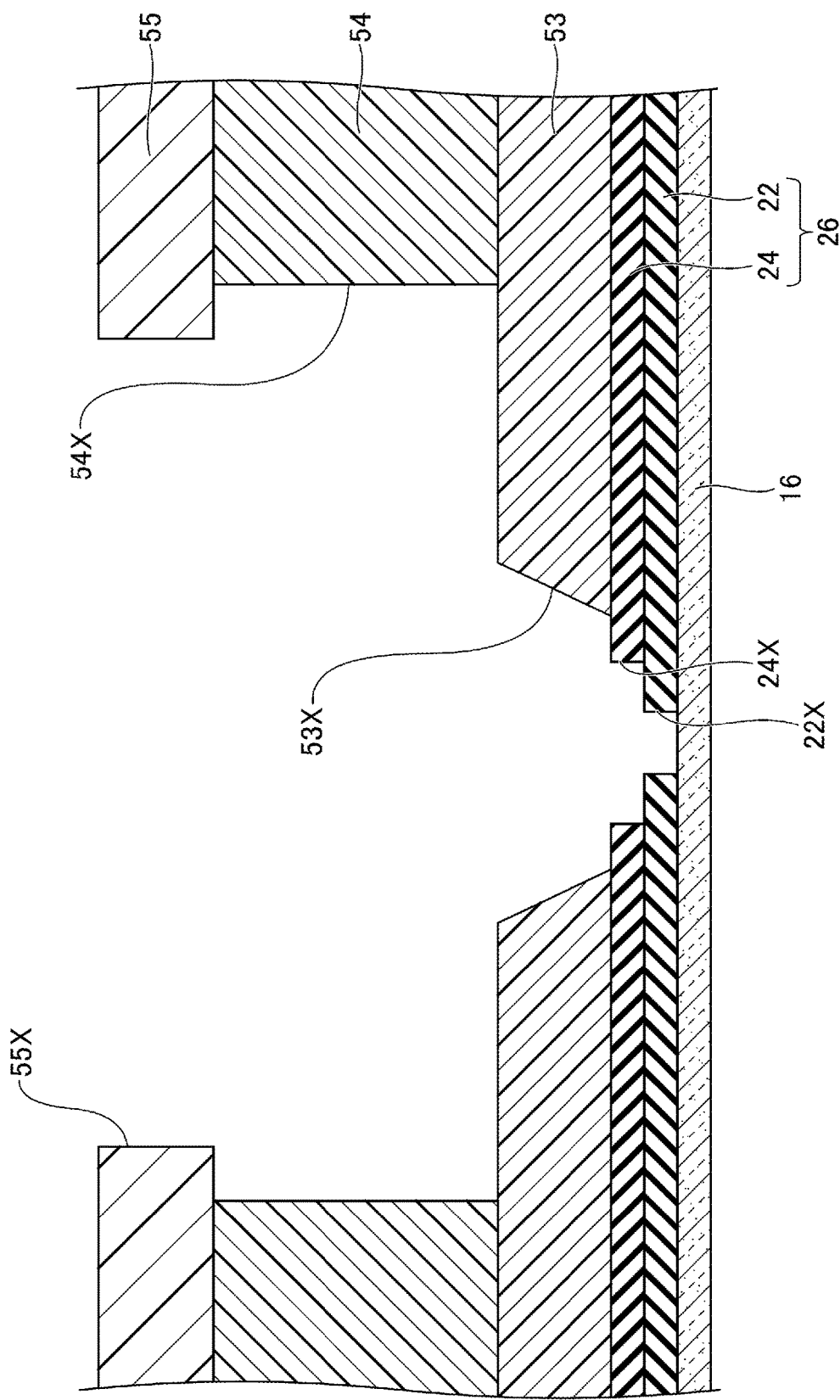
FIG. 12 is a cross-sectional view (part 10) illustrating the method for manufacturing the semiconductor device according to the embodiment.

As shown in FIG. 12, baking is performed, and electron beam resist 53 is deformed so that the opening width at the lower end of opening 53X is smaller than the opening width at the upper end. In other words, a side wall surface of opening 53X is deformed into a tapered shape. Electron beam resist 53 may be deformed so that the lower end of opening 53X coincides with the upper end of opening 24X in a self-aligned manner.

Figure 13:
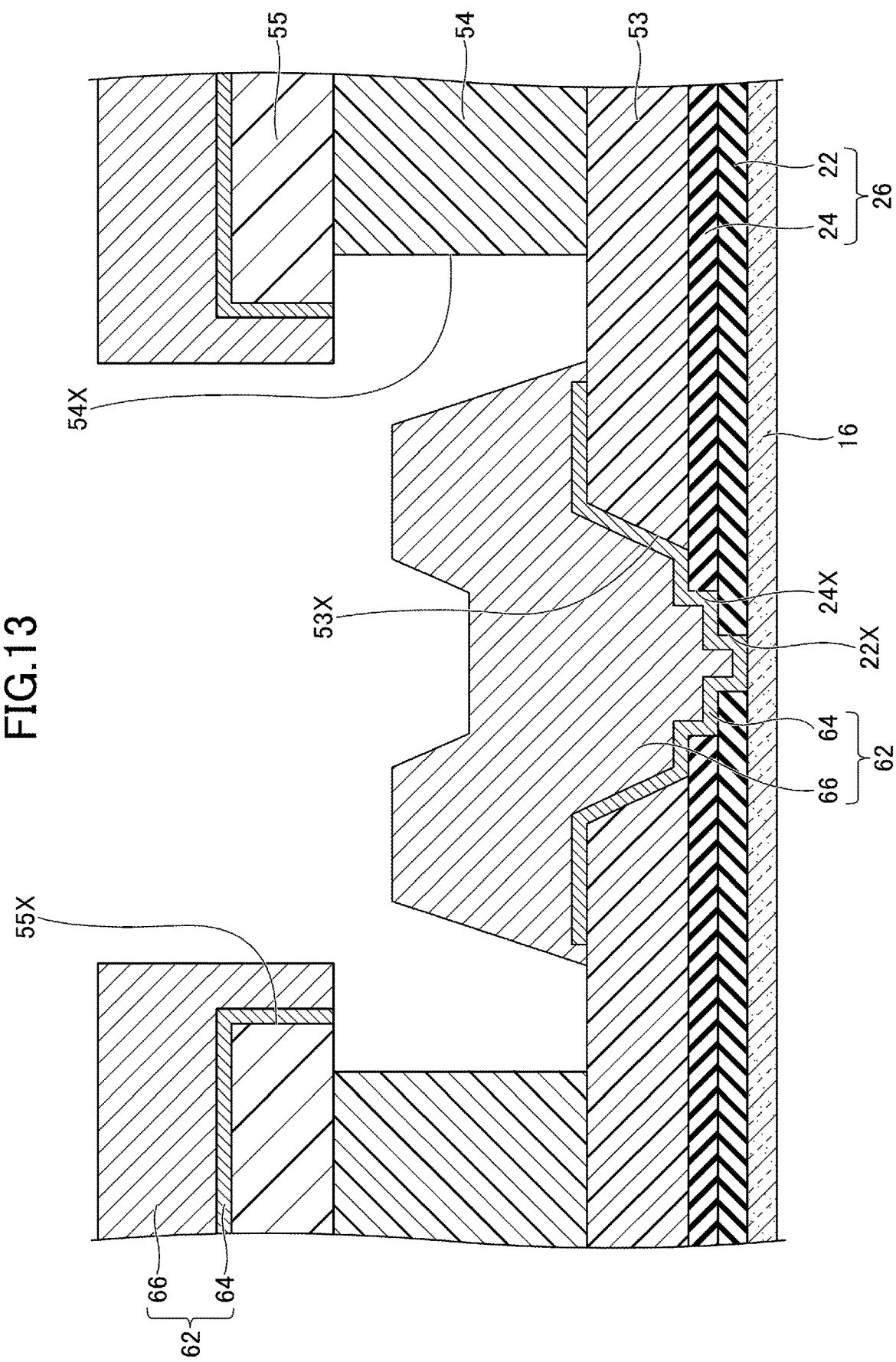
FIG. 13 is a cross-sectional view (part 11) illustrating the method for manufacturing the semiconductor device according to the embodiment.

As shown in FIG. 13, a metal layer 62 is formed inside openings 55X, 54X, 53X, 24X, and 22X by a vapor deposition method. In the formation of metal layer 62, Ni film 64 is formed, and Au film 66 is formed on Ni film 64. For example, the thickness of the Ni-film 64 is approximately 50 nm to 100 nm, and the thickness of the Au film 66 is approximately 300 nm to 600 nm. A Pd film may be formed between Ni film 64 and Au film 66, or a Ta film may be formed on Au film 66. Metal layer 62 is also adhered to the upper surface of electron beam resist 55 and the side wall surface of opening 55X.

Figure 14:
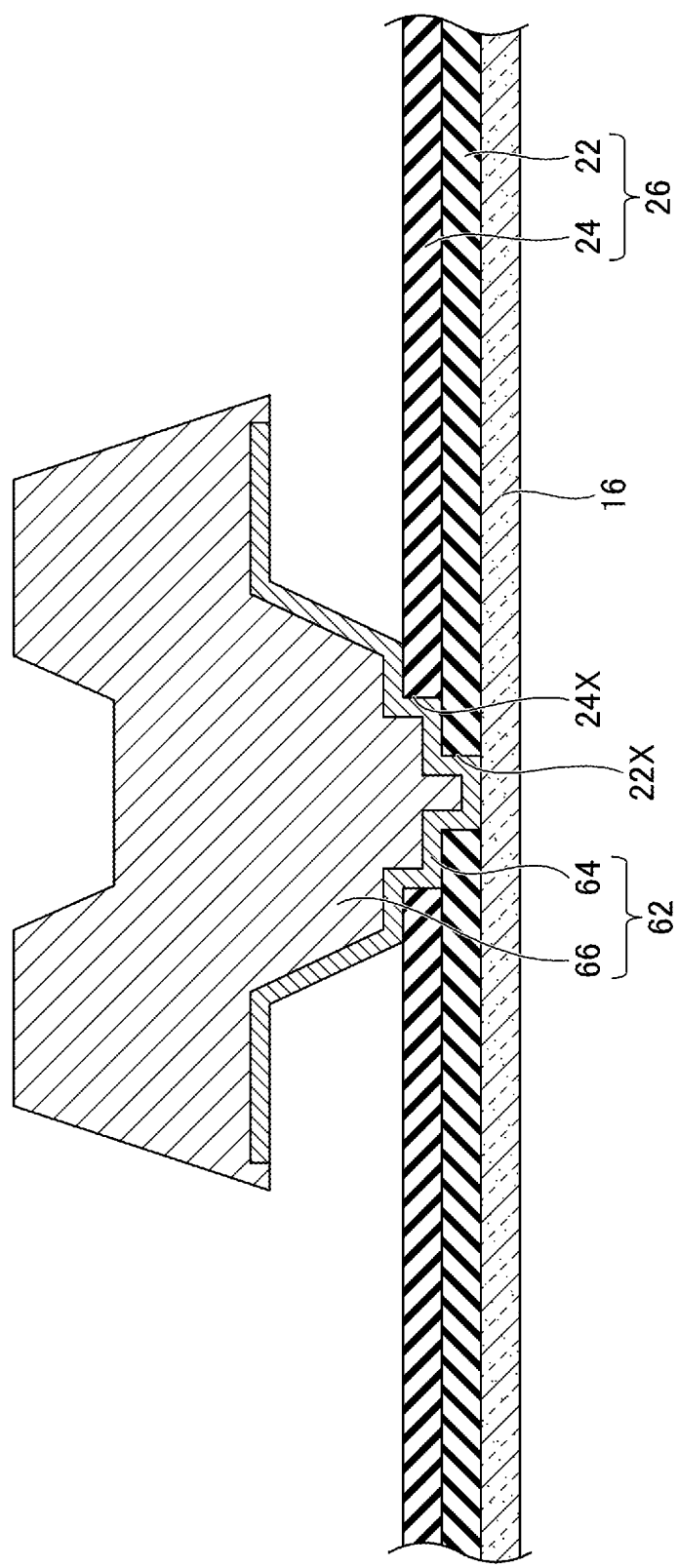
FIG. 14 is a cross-sectional view (part 12) illustrating the method for manufacturing the semiconductor device according to the embodiment.

As shown in FIG. 14, electron beam resists 55, 54 and 53 are removed. As electron beam resists 55, 54, and 53 are removed, the portion of metal layer 62 adhered to electron beam resist 55 is also removed. On the other hand, the portion of metal layer 62 inside opening 24X and 22X and on first insulating film 22 and second insulating film 24 remains intact. In other words, lift-off is performed. The remaining metal layer 62 has, for example, a T-shape in cross-sectional view.

Figure 15:
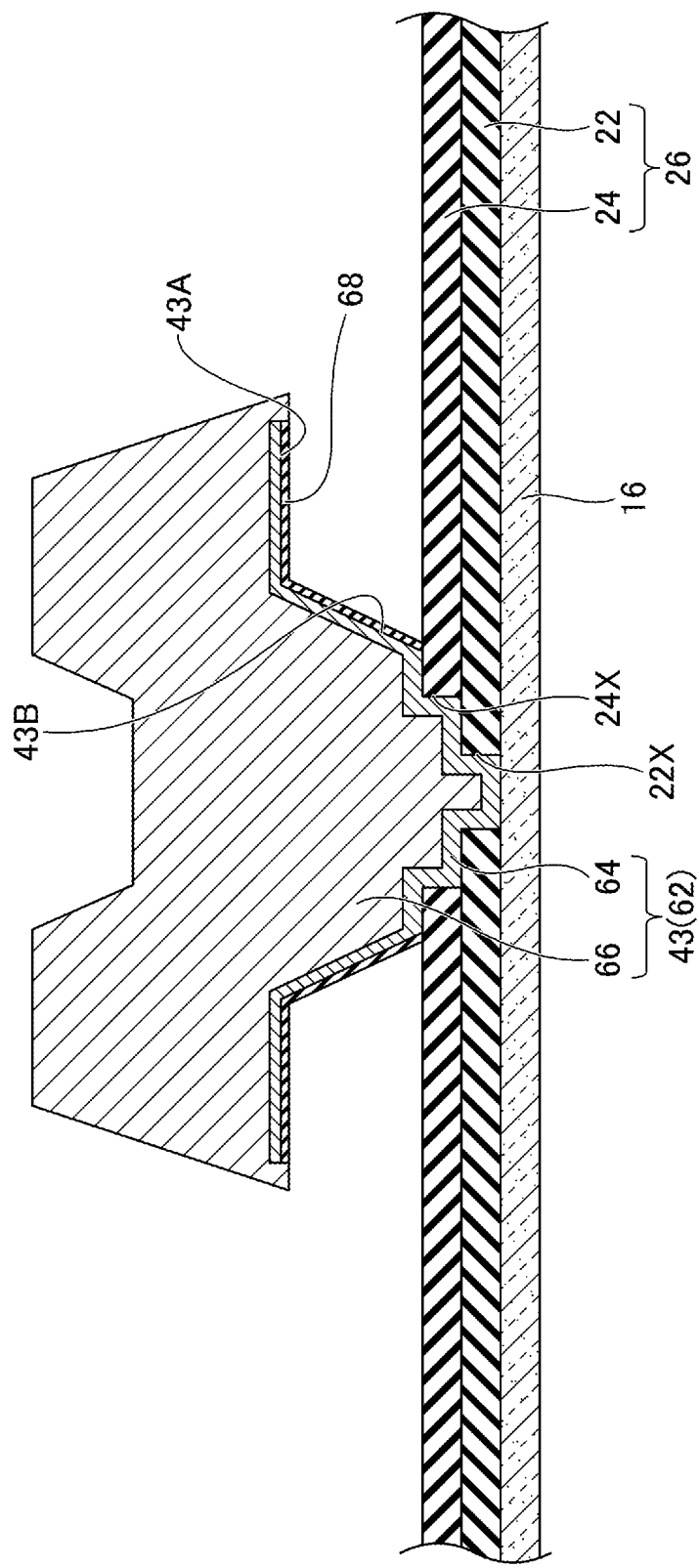
FIG. 15 is a cross-sectional view (part 13) illustrating the method for manufacturing the semiconductor device according to the embodiment.

As shown in FIG. 15, the surface of Ni film 64 included in metal layer 62 is oxidized to form Ni oxide film 68. As a result, gate electrode 43 having Ni film 64 and Au film 66 and making Schottky contact with multi-layer structure 20 through opening 22X is formed. That is, gate electrode 43 is formed as the remainder of metal layer 62, excluding the portion that has become Ni oxide film 68. Gate electrode 43 has, for example, a T-shape in cross-sectional view. Ni film 64 can be oxidized using ozone, for example.

Figure 16:
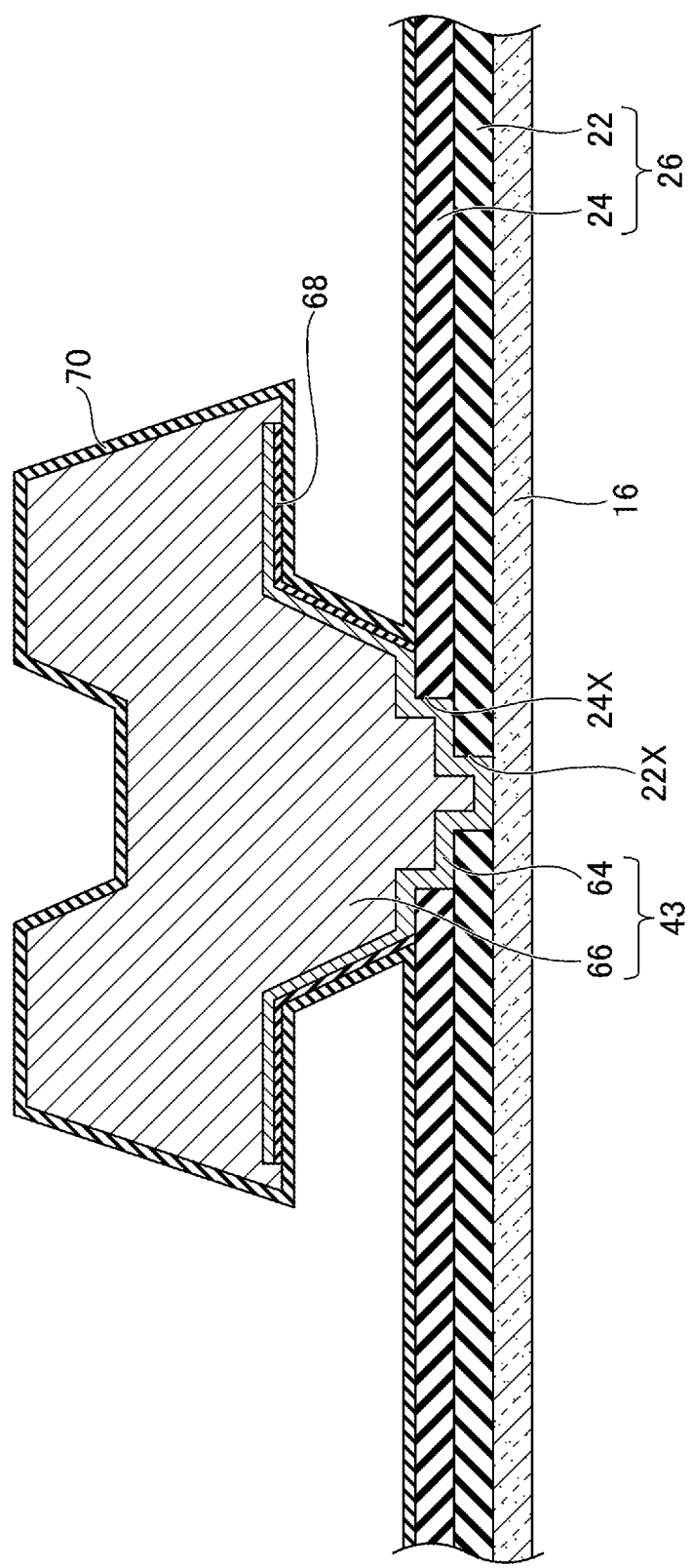
FIG. 16 is a cross-sectional view (part 14) illustrating the method for manufacturing the semiconductor device according to the embodiment.

As shown in FIG. 16, protection film 70 covering gate electrode 43 is formed. Protection film 70 is in contact with Ni oxide film 68 and Au film 66, but is not in contact with Ni film 64. Protection film 70 covers Ni film 64 by being placed over Ni oxide film 68. Protection film 70 is, for example, an Al oxide film or a Si nitride film. The Al oxide film can be formed by, for example, an ALD method. The Si nitride film can be formed by, for example, a plasma CVD method. In the case where the Si nitride film is formed by the plasma CVD method, the Si nitride film may contain fluorine (F) due to the characteristics of the apparatus.

Thereafter, interconnects or the like are formed as necessary. In this manner, semiconductor device 100 including the GaN-HEMT can be manufactured.

According to such a manufacturing method, it is easy to form Ni oxide film 68 that suppresses diffusion of Ni from Ni film 64.

In addition, in a case where an Al oxide film is formed as protection film 70 by an ALD method, the film can be formed using the same apparatus as that used for the oxidation of the surface of Ni film 64. On the other hand, when a Si nitride film is formed as protection film 70 by the CVD method, protection film 70 can be formed at a high deposition rate.

In a case where insulating film 26 includes a Si nitride film, the surface of the Si nitride film may be oxidized. In other words, the surface of insulating film 26 may be a Si oxynitride film. For example, the surface of the Si nitride film may be oxidized in various heat treatments or the like after second insulating film 24 is formed and before Ni film 64 is formed.

Ni film 64 does not need to be continuous from the portion in contact with multi-layer structure 20 to third surface 43A, but may be partially disjunct, as long as Ni film 64 can make Schottky contact with multi-layer structure 20. For example, Ni film 64 may be discontinuous at a corner portion of first insulating film 22 and at a corner portion of second insulating film 24 or the like due to the nature of coverage or the like by vapor deposition.

Although the embodiment has been described above in detail, the present invention is not limited to the specific embodiment, and various modifications and changes can be made within the scope described in the claims.

What is claimed is:

1. A semiconductor device comprising:
a semiconductor layer;
an insulating film disposed on the semiconductor layer and having an opening;
a gate electrode connected to the semiconductor layer through the opening;
a protection film that covers the gate electrode; and
a Ni oxide film,
the insulating film having
   a first surface facing the semiconductor layer, and
   a second surface opposite to the first surface, the gate electrode having
   a third surface spaced apart from the second surface and facing the second surface, and
   a fourth surface connecting the second surface and the third surface, the gate electrode including
   a Ni film that forms the third surface and the fourth surface,
wherein the Ni oxide film covers the Ni film on the third surface and the fourth surface,
wherein the protection film covers the third surface and the fourth surface such that the protection film is laid over the Ni oxide film, and,
wherein a space is located between the second surface and a portion of the protection film, the portion covering the third surface.

2. The semiconductor device according to claim 1, wherein the protection film includes an Al oxide film or a Si nitride film.

3. The semiconductor device according to claim 1, wherein the Ni oxide film has a thickness of more than or equal to 3 nm.

4. A semiconductor device comprising:
a semiconductor layer;
an insulating film disposed on the semiconductor layer and having an opening;
a gate electrode connected to the semiconductor layer through the opening;
a protection film that covers the gate electrode; and
a Ni oxide film,
the insulating film having
   a first surface facing the semiconductor layer, and
   a second surface opposite to the first surface, the gate electrode having
   a third surface spaced apart from the second surface and facing the second surface, and
   a fourth surface connecting the second surface and the third surface, the gate electrode including
   a Ni film that forms the third surface and the fourth surface,
wherein the Ni oxide film covers the Ni film on the third surface and the fourth surface,
wherein the protection film covers the third surface and the fourth surface such that the protection film is laid over the Ni oxide film, and
wherein the protection film further covers the insulating film.

5. A semiconductor device comprising:
a semiconductor layer;
an insulating film disposed on the semiconductor layer and having an opening;
a gate electrode connected to the semiconductor layer through the opening;
a protection film that covers the gate electrode; and
a Ni oxide film,
the insulating film having
   a first surface facing the semiconductor layer, and
   a second surface opposite to the first surface, the gate electrode having
   a third surface spaced apart from the second surface and facing the second surface, and
   a fourth surface connecting the second surface and the third surface, the gate electrode including
   a Ni film that forms the third surface and the fourth surface,
wherein the Ni oxide film covers the Ni film on the third surface and the fourth surface,
wherein the protection film covers the third surface and the fourth surface such that the protection film is laid over the Ni oxide film, and
wherein the Ni film has a first portion that is in contact with the insulating film, the first portion having an area that is less than or equal to 0.10 times as large as a second portion of the Ni film, the second portion being in contact with the Ni oxide film.

6. A semiconductor device comprising:
a semiconductor layer;
an insulating film disposed on the semiconductor layer and having an opening;
a gate electrode connected to the semiconductor layer through the opening;
a protection film that covers the gate electrode and the insulating film, the protection film including an Al oxide film or a Si nitride film; and
a Ni oxide film,
the insulating film having
   a first surface facing the semiconductor layer, and
   a second surface opposite to the first surface, the gate electrode having
   a third surface spaced apart from the second surface and facing the second surface, and
   a fourth surface connecting the second surface and the third surface, the gate electrode including
   a Ni film that forms the third surface and the fourth surface, and
   a Au film on the Ni film,
wherein the Ni oxide film covers the Ni film on the third surface and the fourth surface,
wherein the protection film covers the third surface and the fourth surface such that the protection film is laid over the Ni oxide film, and
wherein a space is located between the second surface and a portion of the protection film, the portion covering the third surface.

* * * * *